US008605505B2

(12) United States Patent
 Kim

(10) Patent No.: US 8,605,505 B2
(45) Date of Patent: Dec. 10, 2013

(54) SEMICONDUCTOR INTEGRATED CIRCUIT AND DATA READ METHOD

(75) Inventor: Myung Su Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 28 days.

(21) Appl. No.: 13/333,158

(22) Filed: Dec. 21, 2011

(65) Prior Publication Data

US 2012/0250410 A1  Oct. 4, 2012

(30) Foreign Application Priority Data

Mar. 28, 2011  (KR) .................. 10-2011-0027573

(51) Int. Cl.
  *G11C 11/34*  (2006.01)
(52) U.S. Cl.
  USPC ................. 365/185.09; 365/185.24
(58) Field of Classification Search
  USPC ......................... 365/185.09, 185.24
  See application file for complete search history.

(56) References Cited

U.S. PATENT DOCUMENTS

| | | | | |
|---|---|---|---|---|
| 8,130,551 | B2 * | 3/2012 | Oowada et al. | 365/185.19 |
| 8,248,850 | B2 * | 8/2012 | Dutta et al. | 365/185.09 |
| 2009/0040841 | A1 * | 2/2009 | Richter et al. | 365/189.16 |
| 2009/0290426 | A1 * | 11/2009 | Moschiano et al. | 365/185.22 |
| 2011/0122703 | A1 * | 5/2011 | Li | 365/185.19 |
| 2012/0163085 | A1 * | 6/2012 | Alrod et al. | 365/185.18 |

FOREIGN PATENT DOCUMENTS

KR  1020090068620 A  6/2009

* cited by examiner

*Primary Examiner* — Michael Tran
(74) *Attorney, Agent, or Firm* — William Park & Associates Patent Ltd.

(57) ABSTRACT

A semiconductor integrated circuit includes a memory cell area comprising a main cell and a spare cell, and a memory controller configured to set an offset value using a program verify level which is set during a program operation, and set a read level using the offset value during a read operation.

18 Claims, 3 Drawing Sheets

SEMICONDUCTOR INTEGRATED CIRCUIT AND DATA READ METHOD

CROSS-REFERENCES TO RELATED APPLICATION

The present application claims priority under 35 U.S.C. §119(a) to Korean application number 10-2011-0027573, filed on Mar. 28, 2011 in the Korean Intellectual Property Office, which is incorporated by reference in its entirety.

BACKGROUND

1. Technical Field

The present invention generally relates to a semiconductor integrated circuit, and more particularly to a semiconductor integrated circuit and a data read method.

2. Related Art

In general, a semiconductor integrated circuit, or particularly, a nonvolatile memory apparatus, includes a memory controller that controls data to be programmed into or read from a memory cell of a memory cell area. The memory cell area of the semiconductor integrated circuit includes a plurality of strings, and each of the strings includes select transistors formed at both ends of memory cells coupled in series to each other. Memory cells formed in different strings are electrically coupled through a word line. Furthermore, each of the strings is electrically coupled to a page buffer configured to sense data through a bit line.

In order to store data in a memory cell, a program operation and a verification operation are repeated to a preset number until data temporarily stored in a page buffer is programmed in a selected memory cell. The verification operation is to verify whether or not a threshold voltage of the selected memory cell is programmed at a specific level or more. For this verification operation, the memory controller of the semiconductor integrated circuit sets and stores a program verification level for each word line according to the characteristic of the word line and program cycling.

FIG. 1 is a flow chart showing a data read process of a conventional semiconductor integrated circuit.

Referring to FIG. 1, when a program command is inputted at step S110, the conventional semiconductor integrated circuit reads a program verification level stored for each word line from a memory controller at step S120, and performs a program operation of a memory block selected from a memory area at step S130.

Then, when a read command is inputted at step S140, the semiconductor integrated circuit reads the stored read level from the memory controller at step S150, and reads data from the memory region based on the read level at step S160.

Then, the semiconductor integrated circuit performs an error correction code (ECC) operation at step S170 to determine whether the ECC operation was successful. When the ECC operation is successful, the data read operation is completed. When the ECC operation is unsuccessful, the semiconductor integrated circuit resets the read level at step S180, and reads data based on the reset the read level from step S160.

In the conventional semiconductor integrated circuit, however, the program verification level and the read level are set for each word line, but are not set for each memory block. Therefore, there are difficulties in resetting the read level of the semiconductor integrated circuit which performs a program or read operation for each memory block.

SUMMARY

A semiconductor integrated circuit and a data read method, which are capable of easily setting a read level, is described herein.

In one embodiment of the present invention, a semiconductor integrated circuit includes a memory cell area comprising a main cell and a spare cell, and a memory controller configured to set an offset value using a program verify level which is set during a program operation, and set a read level using the offset value during a read operation.

In another embodiment of the present invention, a semiconductor integrated circuit includes a memory cell area comprising a main cell and a spare cell and a storage unit configured to store a preset first program verify level and a first read level. A control operation unit may be configured to set a second program verify level according to a condition of the memory cell area during a program operation. The control operation unit may set an offset value using the set second program verify level and the first offset value, and set a read level using the offset value. There may also be an ECC circuit unit configured to determine whether an error exists in data read from the memory cell area, and correct the error.

In another embodiment of the present invention, a data read method of a semiconductor integrated circuit includes setting a second program verify level according to a condition of a memory cell area when a program command is inputted, setting an offset value using the second program verify level and a preset first program verify level, reading data and the offset value when a read command is inputted, and setting a new read level using a preset default read level and the offset value when an ECC operation for the data is determined to be a failure.

BRIEF DESCRIPTION OF THE DRAWINGS

Features, aspects, and embodiments are described in conjunction with the attached drawings.

DETAILED DESCRIPTION

A semiconductor integrated circuit and a data read method will be described below with reference to the accompanying drawings through exemplary embodiments.

Figure 1:
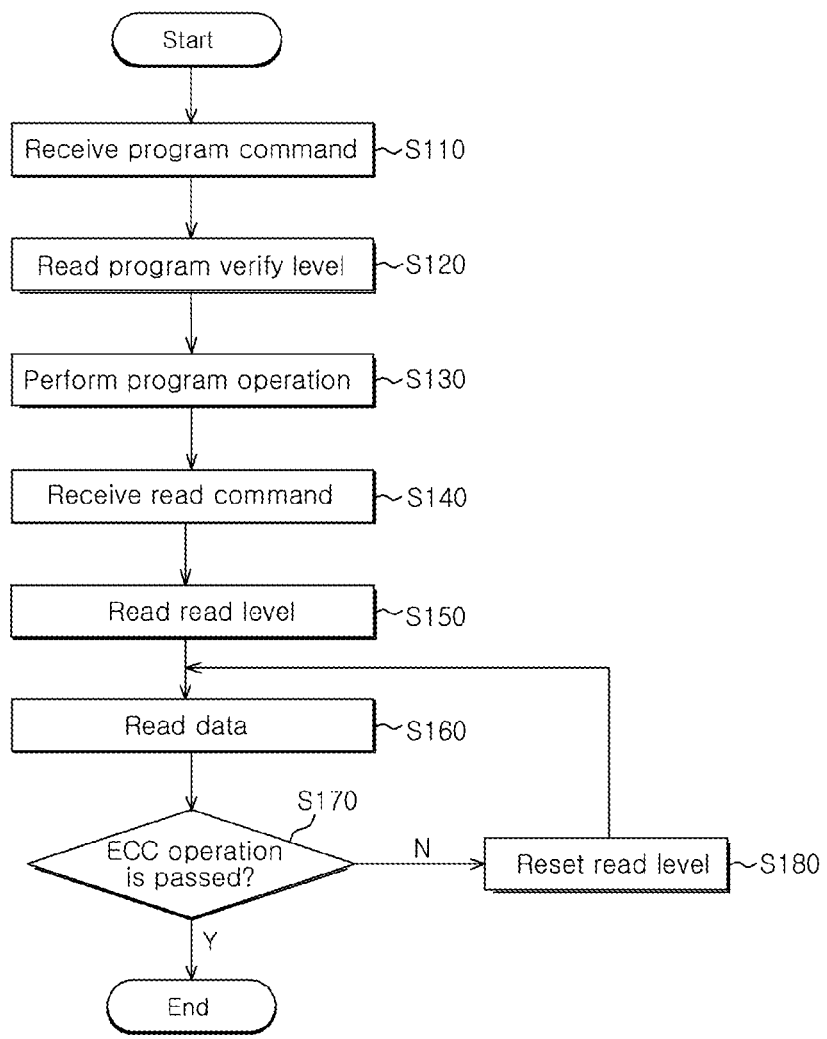
FIG. 1 is a flow chart showing a data read process of a conventional semiconductor integrated circuit.
Figure 2:
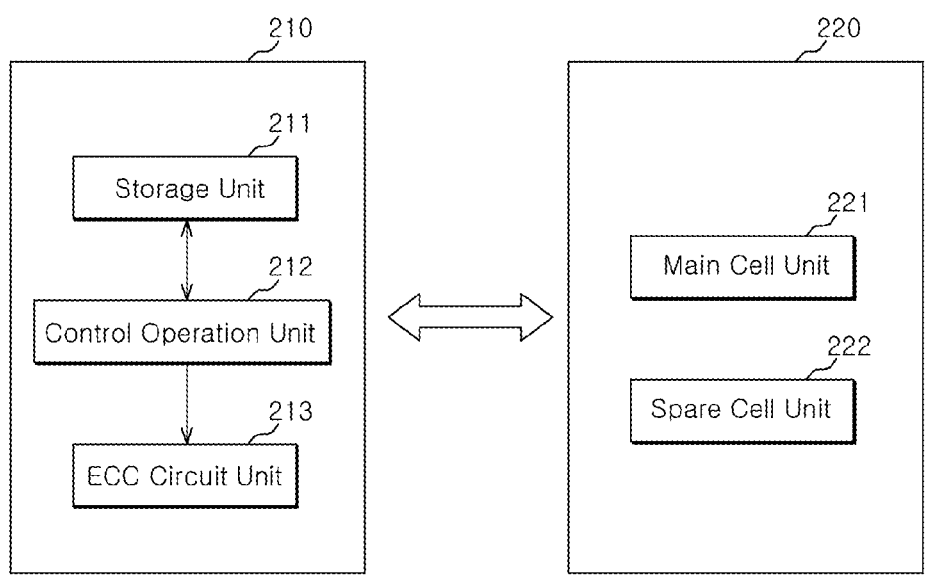
FIG. 2 is a block diagram illustrating a configuration of an exemplary semiconductor integrated circuit according to one embodiment of the invention.

FIG. 2 is a block diagram illustrating the configuration of a semiconductor integrated circuit according to one embodiment of the invention.

Referring to FIG. 2, the semiconductor integrated circuit 200 includes a memory controller 210 and a memory cell area 220.

The memory controller 210 is configured to control a memory cell block of the memory cell area 220 for a program cycle or a read cycle. The memory controller 210 uses an ECC circuit unit 213 to reset a read level when an ECC operation fails. The memory controller 210 may include a storage unit 211, a control operation unit 212, and the ECC circuit unit 213.

The storage unit 211 is configured to store a default program verify level (DPVL) and a default read level. The DPVL is preset as a default value, and the default read level is set on the basis of a condition program verify level (CPVL). Here, the CPVL may be differently set according to one of each word line, memory block or program cycling. Accordingly, the semiconductor integrated circuit 200 according to the embodiment may set a different read level for each memory block.

The control operation unit 212 is configured to set a CPVL according to a condition of the memory cell area 220, when a program command is inputted from a host (not illustrated). The control operation unit 212 subtracts the DPVL stored in the storage unit 211 from the CPVL, and acquires an offset value. The acquired offset value may have a minus value or plus value. The offset value acquired in such a manner is stored in the memory cell area 220. When the semiconductor integrated circuit 200 sets the offset value, the read level may be easily changed and reset for each word line or memory block through the offset value.

When the ECC circuit unit 213 detects an error in a read data, the control operation unit 212 reads the offset value stored in the memory area 220, adds the offset value to the default read level, and sets a new read level. The control operation unit 212 then starts another read operation using the new read level.

The ECC circuit unit 213 is configured to detect and correct errors in data.

The memory cell area 220 is controlled by the memory controller 210 and performs a program, erase, or read operation of data. The memory cell area 220 may include a NAND flash memory. The memory cell area 220 may include a main cell unit 221 and a spare cell unit 222.

The main cell unit 221 includes a plurality of cells, and is configured to perform a program, erase, or read operation.

The spare cell unit 222 is configured to replace a cell in which an error occurs, among the plurality of cells of the main cell unit 221, or store an offset value acquired by the control operation unit 212 of the memory controller 210. The offset value stored in the spare cell unit 222 is read with data stored in the main cell unit 221 when a read command is inputted to the memory controller 210.

The data read process of the semiconductor integrated circuit 200 according to the embodiment will be described in more detail with reference to FIG. 3.

Figure 3:
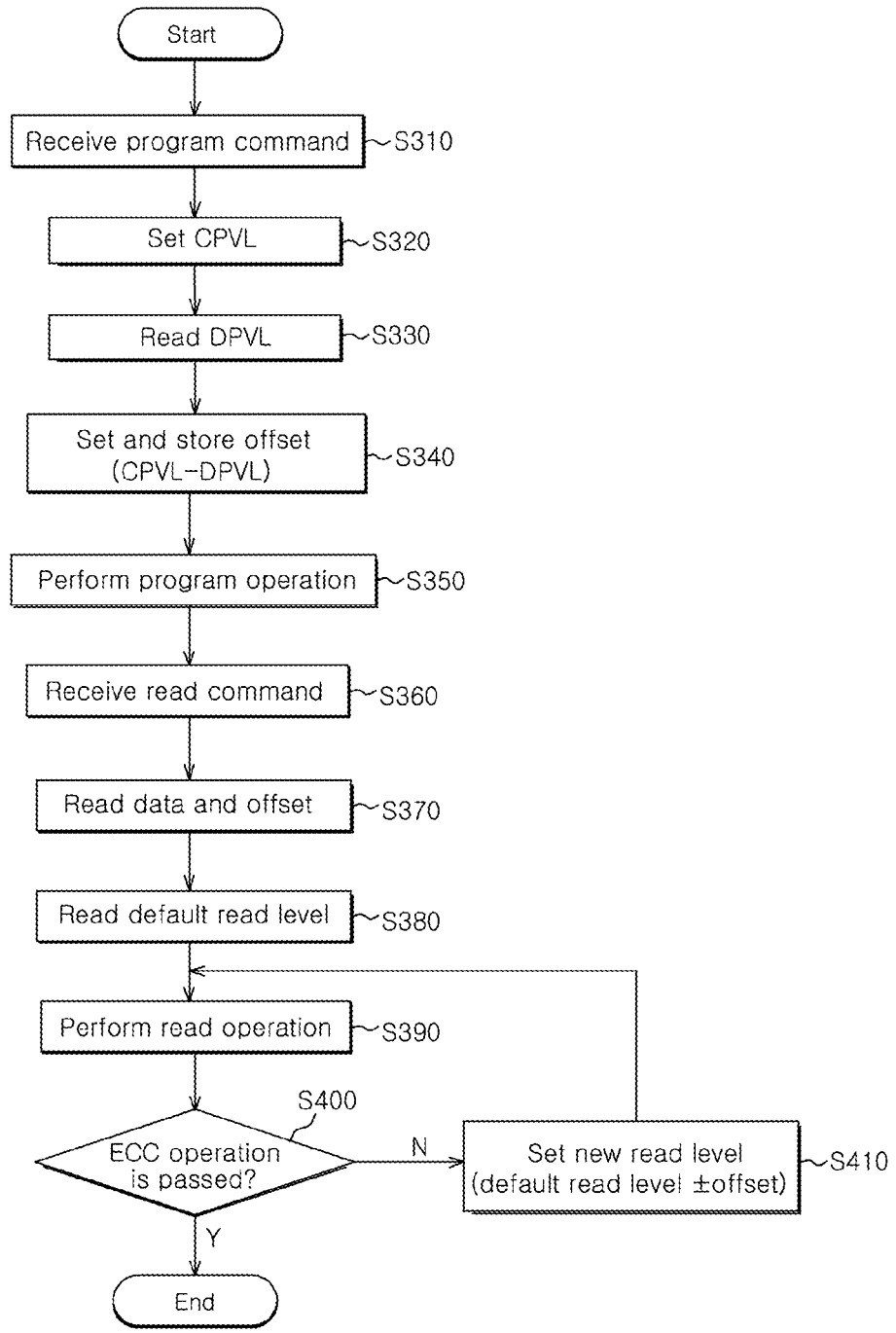
FIG. 3 is a flow chart showing a data read process of the semiconductor integrated circuit according to an embodiment of the invention.

FIG. 3 is a flow chart sequentially showing the data read process of the semiconductor integrated circuit according to the embodiment.

Referring to FIG. 3, when a program command is inputted from a host (not illustrated) at step S310, the semiconductor integrated circuit 200 according to the embodiment sets CPVL according to one of each word line, memory block or program cycling or the like, at step S320.

The semiconductor integrated circuit 200 reads a DPVL which is preset and stored in the storage unit 211 at step S330. At this time, the DPVL corresponds to a level which is preset as a default value.

The semiconductor integrated circuit 200 sets an offset value at step S340. Such an offset value is obtained by subtracting the DPVL from the CPVL. The offset value may include a minus value or plus value. That is, the offset value has a plus value when the CPVL is larger than the DPVL, and has a minus value when the CPVL is smaller than the DPVL. The offset value set in such a manner is stored in the spare cell unit 222 of the memory cell area 220.

Then, the semiconductor integrated circuit 200 performs a program operation based on the CPVL at step S350.

When a read command is inputted from the host at step S360, the offset value and data to read from the memory cell area 220 and then outputted to the outside are simultaneously read at step S370.

The semiconductor integrated circuit 200 reads a default read level stored in the storage unit 211 of the memory controller 210 at step S380, and performs a read operation based on the read default read level at step S390. At this time, the default read level is set on the basis of the CPVL.

Then, the semiconductor integrated circuit 200 performs an ECC operation in step S400 to detect and correct error in the read data. When the ECC operation passes because an error does not exist according to the result of the ECC operation, the data read process of the semiconductor integrated circuit 200 is completed.

On the other hand, when the ECC operation fails because an error exists, the semiconductor integrated circuit 200 adds an absolute value of the read offset value to the default read level, and sets a new read level at step S410. When the read offset value is negative, adding an absolute value of the read offset value to the default read level may comprise subtracting the read offset value from the default read level. The semiconductor integrated circuit 200 performs another read operation based on the set new read level at step S390.

In the semiconductor integrated circuit and the data read method, an offset value is set and stored in the spare cell unit. Then, when a read command is inputted, the offset value is read with data to be read. Then, when an ECC failure occurs, the offset value is used to set a new read level. Therefore, the read level may be more easily reset, and may be differently set for each memory block as well as each word line.

While certain embodiments have been described above, it will be understood to those skilled in the art that the embodiments described are by way of example only. Accordingly, the semiconductor integrated circuit and the data read method described herein should not be limited based on the described embodiments. Rather, the semiconductor integrated circuit and the data read method described herein should only be limited in light of the claims that follow when taken in conjunction with the above description and accompanying drawings.

What is claimed:

1. A semiconductor integrated circuit comprising:
a memory cell area comprising a main cell and a spare cell; and
a memory controller configured to set an offset value using a program verify level which is set during a program operation, and reset a read level using the offset value during a read operation when an error correction code (ECC) operation fails.

2. The semiconductor integrated circuit according to claim 1, wherein the memory controller comprises a storage unit with a default program verify level (DPVL) which is preset as a default value and a condition program verify level (CPVL) which is set according to a condition of the memory cell area during the program operation.

3. The semiconductor integrated circuit according to claim 2, wherein the CPVL is differently set according to one of each word line, memory block or program cycling.

4. The semiconductor integrated circuit according to claim 3, wherein the memory controller determines the offset value by subtracting the DPVL from the CPVL.

5. The semiconductor integrated circuit according to claim 4, wherein the memory controller stores the offset value in the spare cell of the memory cell area.

6. The semiconductor integrated circuit according to claim 5, wherein the memory controller performs control such that data read from the memory cell area and the offset value are read during the read operation.

7. The semiconductor integrated circuit according to claim 6, wherein the memory controller sets a default read level according to the CPVL.

8. The semiconductor integrated circuit according to claim 7, wherein, when an ECC operation is performed on the data and if it is determined that the ECC operation failed, the memory controller adds an absolute value of the offset value to the default read level to set a new read level.

9. A semiconductor integrated circuit comprising:
   a memory cell area comprising a main cell and a spare cell;
   a storage unit configured to store a preset first program verify level and a first read level;
   a control operation unit, configured to set a second program verify level according to a condition of the memory cell area during a program operation, sets an offset value using the set second program verify level and the first program verify level, and sets a read level using the offset value; and
   an ECC circuit unit configured to determine whether an error exists in data read from the memory cell area, and correct the error.

10. The semiconductor integrated circuit according to claim 9, wherein the control operation unit subtracts the second program verify level from the first program verify level to set the offset value.

11. The semiconductor integrated circuit according to claim 10, wherein the control operation unit controls the offset value to be stored in the spare cell of the memory cell area.

12. The semiconductor integrated circuit according to claim 10, wherein the first program verify level is preset as a default value.

13. The semiconductor integrated circuit according to claim 10, wherein the second program verify level is preset according to one of each word line, memory block of the memory cell area or program cycling.

14. The semiconductor integrated circuit according to claim 9, wherein, when the operation of the ECC circuit unit is determined to be a failure, the control operation unit adds an absolute value of the offset value to the first read level to set a new read level.

15. The semiconductor integrated circuit according to claim 14, wherein the first read level is set on the basis of the second program verify level.

16. A data read method of a semiconductor integrated circuit, comprising:
   setting a second program verify level according to a condition of a memory cell area when a program command is inputted;
   setting an offset value using the second program verify level and a preset first program verify level;
   reading data and the offset value when a read command is inputted; and
   setting a new read level using a preset default read level and the offset value when an ECC operation for the data is determined to be a failure.

17. The data read method according to claim 16, wherein the setting of the offset value comprises subtracting the first program verify level from the second program verify level.

18. The data read method according to claim 16, wherein the setting of the new read level comprises adding an absolute value of the offset value to the preset default read level to set the new read level.

* * * * *